United States Patent
Tsujimura

(10) Patent No.: US 8,312,412 B2
(45) Date of Patent: Nov. 13, 2012

(54) SUPPORT APPARATUS AND DESIGN SUPPORT METHOD

(75) Inventor: Toshihiro Tsujimura, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 318 days.

(21) Appl. No.: 12/825,112

(22) Filed: Jun. 28, 2010

(65) Prior Publication Data

US 2010/0333059 A1    Dec. 30, 2010

(30) Foreign Application Priority Data

Jun. 30, 2009    (JP) .................................. 2009-156005

(51) Int. Cl.
 *G06F 17/50*    (2006.01)
(52) U.S. Cl. ........ 716/137; 716/109; 716/115; 716/120; 716/133; 716/136
(58) Field of Classification Search ........................ None
See application file for complete search history.

(56) References Cited

U.S. PATENT DOCUMENTS

| | | | |
|---|---|---|---|
| 5,250,809 A * | 10/1993 | Nakata et al. | 250/330 |
| 6,389,582 B1 * | 5/2002 | Valainis et al. | 716/122 |
| 6,662,345 B2 * | 12/2003 | Uchida et al. | 716/111 |
| 7,114,132 B2 * | 9/2006 | Yaguchi | 716/115 |
| 7,912,692 B2 * | 3/2011 | Matsushita et al. | 703/13 |
| 8,019,580 B1 * | 9/2011 | Chandra et al. | 703/6 |
| 2009/0024347 A1 * | 1/2009 | Chandra et al. | 702/130 |

FOREIGN PATENT DOCUMENTS

| | | |
|---|---|---|
| JP | 2005-327296 | 12/1993 |
| JP | H05-327296 | 12/1993 |
| JP | 2005-084895 | 3/2005 |
| JP | 2008-097511 | 4/2008 |
| WO | WO 2008/135596 A2 * | 11/2008 |

OTHER PUBLICATIONS

Final Notice of Rejection mailed by the Japan Patent Office on Mar. 15, 2011 in corresponding Japanese app. No. 2009-156005 in 4 pages.
Final Notice of Rejection mailed by the Japan Patent Office on Dec. 21, 2010 in corresponding Japanese app. No. 2009-156005 in 7 pages.
Notice of Reasons for Rejection mailed by the Japan Patent Office on Sep. 21, 2010 in corresponding Japanese app. No. 2009-156005 in 5 pages.
Information Sheet for preparing an Information Disclosure Statement under Rule 1.56.

* cited by examiner

*Primary Examiner* — Leigh Garbowaki
(74) *Attorney, Agent, or Firm* — Knobbe, Martens, Olson & Bear, LLP

(57) ABSTRACT

According to one embodiment, a design support method includes generating first layout data when first electronic components and first positions of the first electronic components on a printed circuit board are specified, computing temperature distribution data showing a temperature distribution on a surface of the board, acquiring a maximum thermal resistance temperature of the second electronic component when the second electronic component is specified, calculating a first temperature on the surface at a second position based on the temperature distribution data when the second position is specified, determining whether the second electronic component can be arranged at the second position based on the first temperature and the maximum thermal resistance temperature, and prohibiting generation of a second layout data when it is determined that the second electronic component can be arranged at the second position, the second layout data showing the first positions and the second position.

8 Claims, 4 Drawing Sheets

|  | Minimum | Normal | Maximum |
|---|---|---|---|
| Rated 1 |  | 1 Ω |  |
| Rated 2 |  | 0.5W |  |
| ... | ... | ... | ... |
| Thermal resistance temperature | −40°C |  | 65°C |
| ... | ... | ... | ... |
F I G. 2
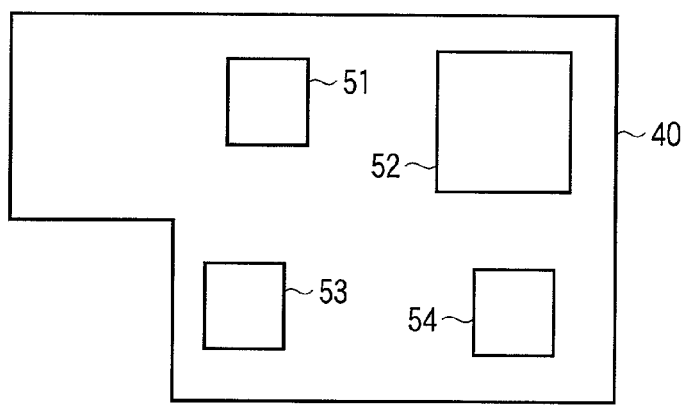
F I G. 3
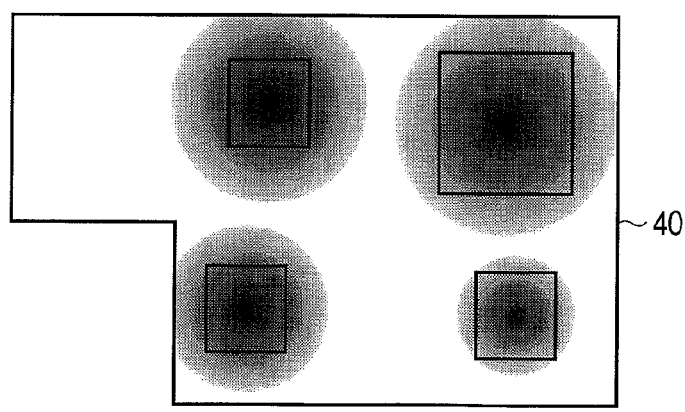
F I G. 4

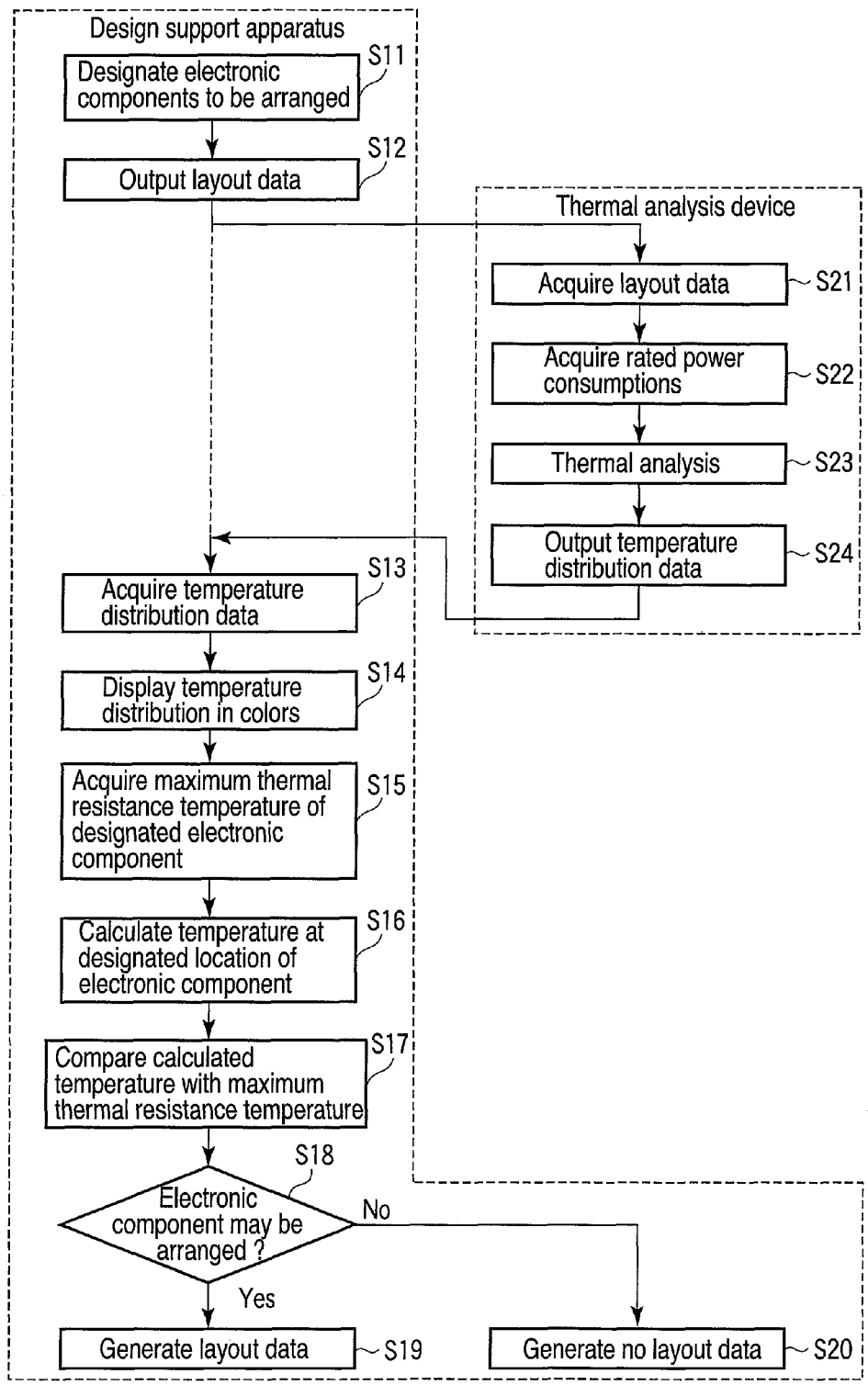
F I G. 7

SUPPORT APPARATUS AND DESIGN SUPPORT METHOD

CROSS-REFERENCE TO RELATED APPLICATIONS

This application is based upon and claims the benefit of priority from Japanese Patent Application No. 2009-156005, filed Jun. 30, 2009; the entire contents of which are incorporated herein by reference.

FIELD

Embodiments described herein relate generally to a design support apparatus and a design support method for supporting the task of arranging electronic components on a printed circuit board.

BACKGROUND

Recently, the task of arranging electronic components on a printed circuit board is carried out by computer assisted design (CAD).

In the meantime, the calorific value as well as the power consumption of an IC is on the increase. There is also an increase of thermal density owing to high-density packaging of components. As a result, the heat of the main IC has an adverse effect of, for example, breaking down neighboring ICs and components. A thermal analysis is therefore needed to know the calorific value in advance.

Jpn. Pat. Appln. KOKAI Publication No. 5-327296 has disclosed a technique for calculating an ambient temperature every arrangement of a component, temporarily arranging components that have not been arranged yet in order to calculate a temperature so that the components that have been already arranged are also included, and deciding the arrangement if the temperature is an allowable temperature.

On the other hand, when a thermal analysis is conducted for a printed circuit board having a great number of electronic components arranged thereon, a considerable amount of time may be taken or the thermal analysis may not be conducted normally.

At the final stage of the arrangement task according to the technique disclosed in the above-mentioned document, a great number of electronic components are arranged on the printed circuit board. Hence, a considerable amount of time is taken before the end of the arrangement task because the time-consuming thermal analysis is conducted every arrangement of a component.

BRIEF DESCRIPTION OF THE DRAWINGS

FIG. 2 is an exemplary diagram showing information regarding an electronic component stored in a component information;

FIG. 3 is an exemplary diagram showing how electronic components that meet conditions are arranged on a printed circuit board;

FIG. 4 is an exemplary diagram showing how information indicating temperatures is superposed on the printed circuit board shown in FIG. 3;

FIG. 7 is an exemplary flowchart showing procedures of the arrangement task and thermal analysis processing for the electronic components.

DETAILED DESCRIPTION

In general, according to one embodiment, a design support apparatus comprises a component arrangement module configured to generate first layout data when first electronic components and first arrangement positions of the first electronic components on a printed circuit board are specified by an input device, and to generate second layout data when a second electronic component and a second arrangement position of the second electronic component on the printed circuit board are specified by the input device after generating the first layout data, the first layout data showing the first arrangement positions, the first electronic components matching a predetermined condition, and the second layout data showing the first arrangement positions and the second arrangement position, a temperature distribution data acquisition module configured to acquire temperature distribution data showing a temperature distribution on a surface of the printed circuit board, the temperature distribution data being computed by a thermal analysis conducted based on the first layout data and power consumptions of the first electronic components, a thermal resistance temperature acquisition module configured to acquire a maximum thermal resistance temperature of a second electronic component when the second electronic component is specified by the input device, a calculator configured to calculate a first temperature on the surface of the printed circuit board at the second arrangement position based on the temperature distribution data when the second arrangement position is specified by the input device, a determination module configured to determine whether the second electronic component is able to be arranged at the second arrangement position based on the first temperature and the maximum thermal resistance temperature, and a prohibition module configured to prohibit the component arrangement module from generating the second layout data when the determination module determines that the second electronic component is not able to be arranged at the second arrangement position.

Figure 1:
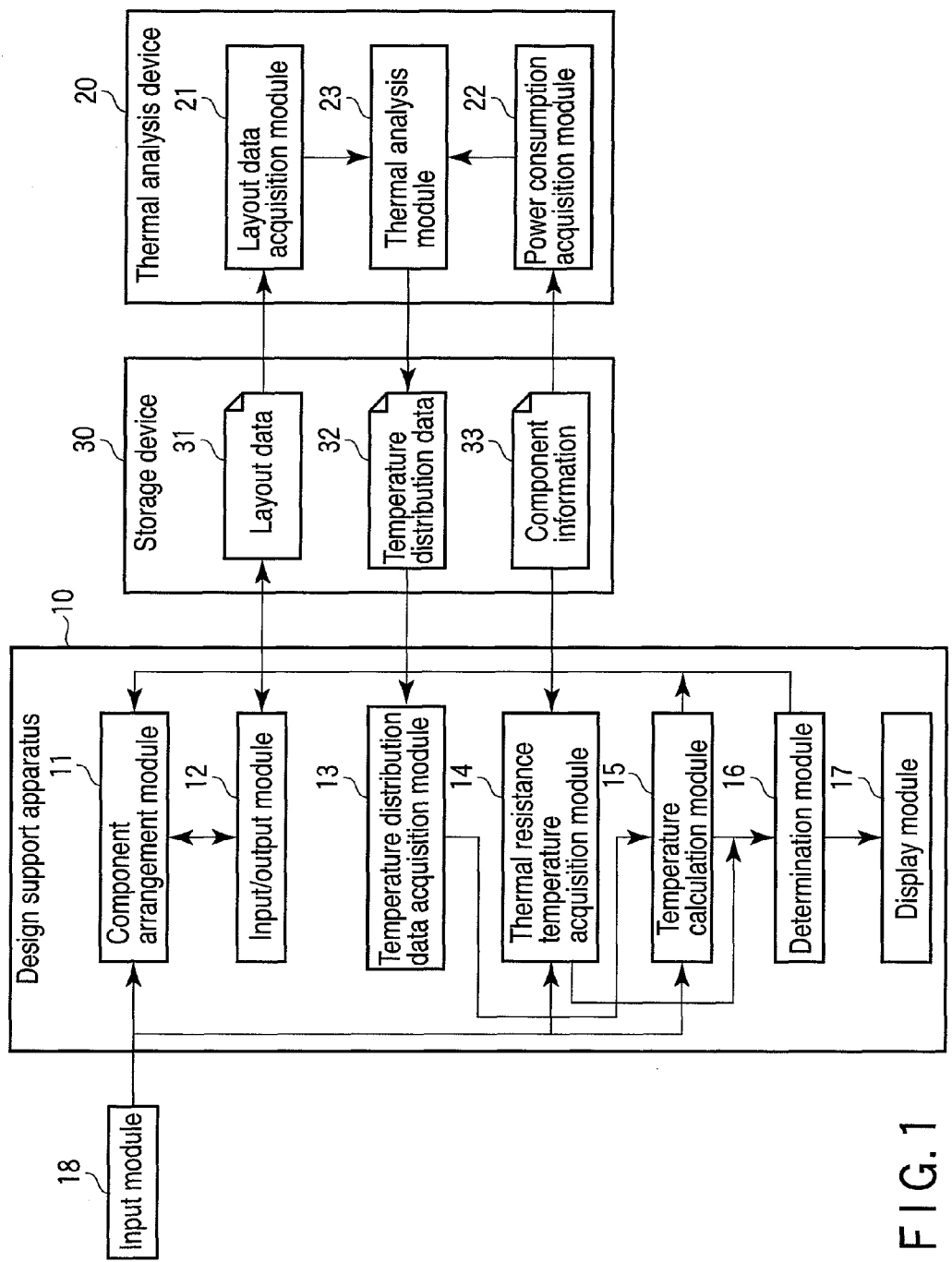
FIG. 1 is an exemplary block diagram showing the configurations of a design support apparatus and a thermal analysis device according to one embodiment of the present invention.

FIG. 1 is a block diagram showing the configurations of a design support apparatus 10 and a thermal analysis device 20 according to one embodiment of the present invention.

The design support apparatus 10 comprises, for example, a component arrangement module 11, an input/output module 12, a temperature distribution data acquisition module 13, a thermal resistance temperature acquisition module 14, a temperature calculation module 15, a determination module 16 and a display module 17. Part or all of the processing performed by the design support apparatus 10 is enabled by a program to be executed by a computer.

The component arrangement module 11 generates layout data showing how electronic components designated by an operator through an input from an input unit 18 are arranged at positions on a printed circuit board designated by an input from the input unit 18. The display module 17 displays, on a display screen, the appearances of the printed circuit board and the electronic components based on the layout data. The input/output module 12 performs processing for storing the layout data in a storage device.

Information regarding the electronic components to be arranged on the printed circuit board is stored in a component information 33 within a storage device 30. The information regarding every electronic component to be arranged on the printed circuit board is stored in the component information 33; for example, the rated value of a resistor, the rated power consumption, and the minimum and maximum thermal resistance temperatures. FIG. 2 shows information regarding an electronic component stored in the component information 33.

Furthermore, the component arrangement module 11 designates the electronic components to be arranged for the operator before the operator starts the task of arranging the electronic components on the printed circuit board. The electronic components to be arranged are electronic components that meet preset conditions. The electronic components that meet the preset conditions are, for example, electronic components having rated power consumptions greater than or equal to a preset power value. Moreover, when the printed circuit board is a motherboard of a computer, the electronic components that meet the preset conditions are a semiconductor chip including a processor, a semiconductor chip including a circuit with a chip set function, a semiconductor chip including a graphics processing unit (GPU), and a power supply IC. These electronic components (semiconductor chips) are components which have been known in advance to have high power consumption even if the rated power consumptions are not checked. FIG. 3 shows how the designated electronic components are arranged on the printed circuit board. As shown in FIG. 3, electronic components 51 to 54 are arranged on a printed circuit board 40.

The temperature distribution data acquisition module 13 acquires, from the storage device 30, the layout data showing how the electronic components that meet the set conditions are arranged on the printed circuit board, and temperature distribution data 32 which shows a temperature distribution on the surface of the printed circuit board and which is computed by a thermal analysis conducted in accordance with the rated power consumptions of the electronic components that meet the conditions. The thermal analysis is conducted by the thermal analysis device 20. The thermal analysis device 20 conducts the thermal analysis for the layout data in which the electronic components that meet the conditions are arranged. The temperature distribution data acquisition module 13 passes the acquired temperature distribution data to the temperature calculation module 15 and the display module 17.

Figure 5:
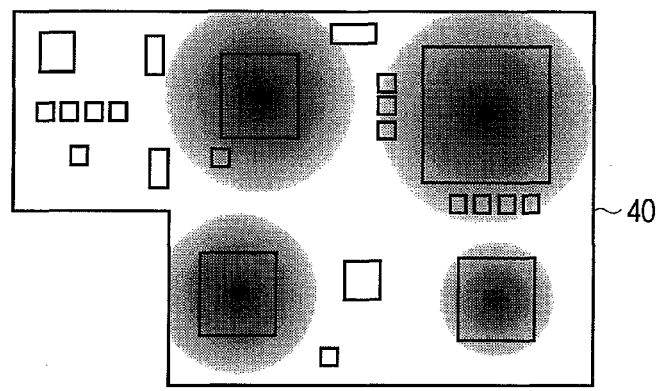
FIG. 5 is an exemplary diagram showing how electronic components are further arranged on the printed circuit board shown in FIG. 4.

The display module 17 displays the information indicating the temperatures on the surface of the printed circuit board based on the temperature distribution data 32 so that this information is superposed on a figure indicating the printed circuit board. FIG. 4 shows an example of the figure indicating the printed circuit board and temperature information that are displayed by the display module 17. As shown in FIG. 4, a temperature distribution is indicated in colors corresponding to temperatures. The temperature distribution is indicated in colors so that the operator more easily recognizes the temperatures on the substrate surface. FIG. 5 shows the state of the printed circuit board on which the electronic components are arranged by an arrangement task after the thermal analysis has ended. The electronic components can be arranged in accordance with the colors that indicate the thermal distribution. For example, the operator arranges the electronic components having low maximum thermal resistance temperatures in parts at lower temperatures (parts having paler colors).

When electronic components for which locations are to be designated through the input unit 18 are indicated, the thermal resistance temperature acquisition module 14 acquires the maximum thermal resistance temperature from the component information 33. The thermal resistance temperature acquisition module 14 passes the acquired maximum thermal resistance temperature to the determination module 16.

When a location for the electronic component is designated through the input unit 18, the temperature calculation module 15 calculates the temperature on the surface of the printed circuit board at the location designated in accordance with the temperature distribution data 32. The temperature calculation module 15 passes the calculated temperature to the determination module 16.

The determination module 16 compares the temperature of the location with the maximum thermal resistance temperature, and then determines whether to allow the designated electronic component to be arranged at the designated location. When the temperature of the location is less than or equal to the maximum thermal resistance temperature, the determination module 16 determines that the designated electronic component may be arranged at the designated location. When the temperature of the location is higher than the maximum thermal resistance temperature, the determination module 16 determines that the designated electronic component may not be arranged at the designated location. The determination module 16 notifies the component arrangement module 11 and the display module 17 of the determination.

Figure 6:
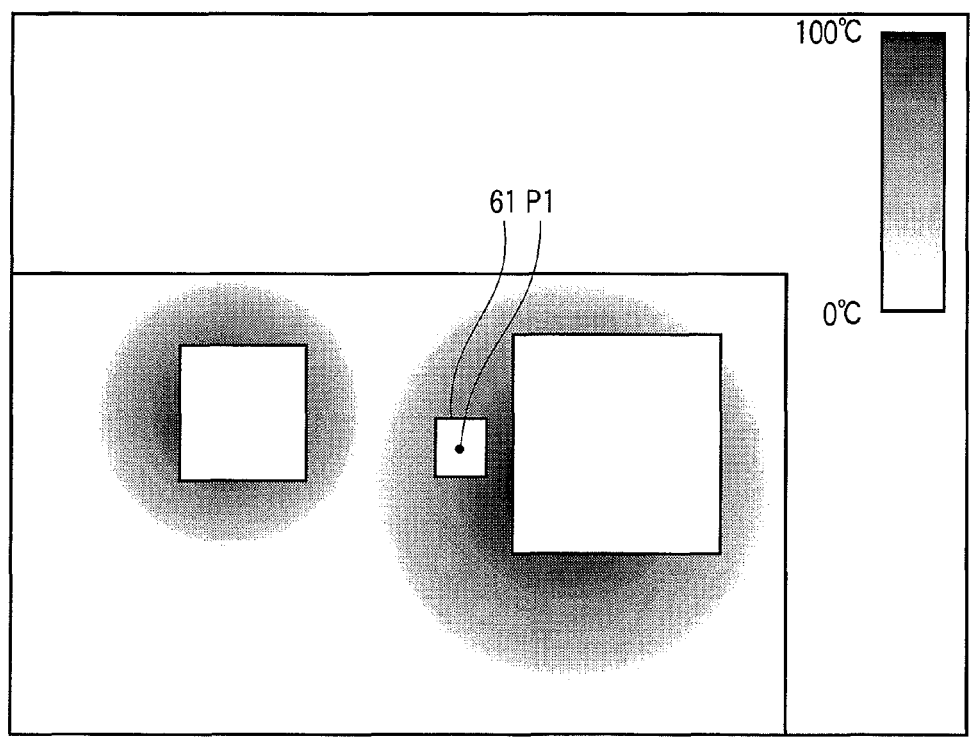
FIG. 6 is an exemplary diagram showing how electronic components are arranged on the printed circuit board.

For example, suppose that the operator selects an electronic component 61 for which information shown in FIG. 2 is stored in the component information 33 and that the operator then instructs to arrange the electronic component 61 at a position P1 on the printed circuit board as shown in FIG. 6. In this case, the thermal resistance temperature acquisition module 14 acquires, from the component information 33, 65° C. as a maximum thermal resistance temperature. Further, the temperature calculation module 15 calculates the temperature of the designated position, and obtains 70° C. as a calculation. In this case, as the calculated temperature (70° C.) is higher than the maximum thermal resistance temperature (65° C.), the determination module 16 determines that the electronic component 61 cannot be arranged at the designated position P1.

When notified that the electronic component may be arranged at the designated position, the component arrangement module 11 generates layout data showing how the designated electronic component is arranged at the designated location. When notified that the electronic component may not be arranged at the designated position, the component arrangement module 11 generates no layout data showing how the designated electronic component is arranged at the designated location.

When notified that the electronic component may not be arranged at the designated position, the display module 17 indicates, on the display screen of a display, a message saying that the designated electronic component may not be arranged at the designated location.

Now, the configuration of the thermal analysis device 20 for conducting the thermal analysis is described. Part or all of the processing performed by the thermal analysis device 20 is enabled by a program to be executed by a computer. The thermal analysis device 20 comprises, for example, a layout data acquisition module 21, a power consumption acquisition module 22 and a thermal analysis module 23.

The layout data acquisition module 21 acquires the layout data which has been stored in the storage device 30 by the design support apparatus 10. The power consumption acquisition module 22 acquires, from the component information 33, the rated power consumptions of the electronic components that are arranged on the printed circuit board in accordance with the layout data. The thermal analysis module 23 conducts a thermal analysis in accordance with the layout data and the rated power consumptions, and thereby computes a temperature distribution on the surface of the printed circuit board. The thermal analysis module 23 records the computation in the storage device as thermal distribution data.

Now, procedures of the arrangement task and thermal analysis processing for the electronic components are described referring to a flowchart of FIG. 7.

The component arrangement module 11 designates, for the operator, the arrangement of electronic components which meet the preset conditions and which are to be arranged, from among electronic components mounted on the printed circuit board (step S11).

The operator uses the input unit 18 to designate one electronic component to be arranged from among the designated electronic components. The operator then uses the input unit 18 to indicate to the component arrangement module 11 a location for the designated electronic component. The operator designates each of the designated electronic components and designates a location therefor.

After the operator has arranged the electronic components that meet the preset conditions, the component arrangement module 11 instructs the operator to stop the arrangement task of the electronic components, and outputs, to the storage device, layout data (first layout data) showing how the electronic components that meet the preset conditions are arranged on the printed circuit board (step S12).

The layout data acquisition module 21 of the thermal analysis device 20 acquires the layout data stored in the storage device, and passes the layout data to the thermal analysis module 23 (step S21). The power consumption acquisition module 22 acquires the rated power consumptions of the electronic components included in the layout data from the component information 33, and passes the same to the thermal analysis module 23 (step S22).

The thermal analysis module 23 conducts a thermal analysis in accordance with the layout data and in accordance with the rated power consumptions passed from the power consumption acquisition module 22, and computes a temperature distribution on the surface of the printed circuit board (step S23). The thermal analysis module 23 outputs the result of the analysis to the storage device as temperature distribution data (step S24).

After the thermal analysis has ended, the temperature distribution data acquisition module 13 is instructed by the operator to acquire the temperature distribution data 32. The temperature distribution data acquisition module 13 acquires the temperature distribution data 32 from the storage device (step S13), and passes the acquired temperature distribution data 32 to the temperature calculation module 15. The temperature calculation module 15 computes data such that information indicating the temperatures on the surface of the printed circuit board in accordance with the temperature distribution data 32 (distribution map indicating a temperature distribution in colors) is superposed on the printed circuit board. The temperature calculation module 15 then passes the data to the component arrangement module 11. In accordance with the passed data, the component arrangement module 11 displays the distribution map indicating the temperature distribution in colors in a state superposed on the printed circuit board (step S14).

Furthermore, the remaining electronic components are arranged on the printed circuit board on which the electronic components that meet the conditions have been arranged.

When the operator uses the input unit 18 to designate the electronic component to be arranged on the printed circuit board, the thermal resistance temperature acquisition module 14 acquires the maximum thermal resistance temperature from the component information 33 (step S15). The thermal resistance temperature acquisition module 14 passes the acquired maximum thermal resistance temperature to the determination module 16. When the operator uses the input unit 18 to designate a location for the electronic component designated by the operator, the temperature calculation module 15 calculates the temperature of the designated location in accordance with the temperature distribution data 32 (step S16), and the temperature calculation module 15 then passes the calculated temperature to the determination module 16.

The determination module 16 compares the calculated temperature that has been passed with the maximum thermal resistance temperature of the electronic component, and determines whether to allow the electronic component to be arranged at the designated location (step S17). When the calculated temperature is less than or equal to the maximum thermal resistance temperature, the determination module 16 determines that the electronic component may be arranged at the designated location (OK) (Yes in step S18). When the calculated temperature is higher than the maximum thermal resistance temperature, the determination module 16 determines that the electronic component may not be arranged at the designated location (NG) (No in step S18). The determination module 16 passes the determination to the component arrangement module 11 and the display module 17.

When the determination is OK (Yes in step S18), the determination module 16 notifies the component arrangement module 11 that the determination is OK in order to prompt the component arrangement module 11 to generate layout data showing how the designated electronic component is arranged at the designated location. When the determination is OK, the component arrangement module 11 generates the layout data showing how the designated electronic component is arranged at the designated location (step S19).

When the determination is NG (No in step S18), the determination module 16 notifies the component arrangement module 11 that the determination is NG in order to prohibit the generation of the layout data showing how the designated electronic component is arranged at the designated location (step S20). The component arrangement module 11 does not generate the layout data showing how the designated electronic component is arranged at the designated location. Moreover, when the determination is NG, the display module 17 displays, on the display screen of the display, the fact that the designated electronic component cannot be arranged at the designated location, and thereby notifies the operator that the electronic component cannot be arranged at the designated location. Then, the above-described arrangement task is continued until all the electronic components are arranged on the printed circuit board.

As described above, the design support apparatus 10 outputs the layout data in which the electronic components that meet the preset conditions are arranged. Then, in accordance with this layout data, the thermal analysis device 20 conducts a thermal analysis. Since the electronic components included in the layout data are some of the electronic components to be arranged on the printed circuit board, the time required for the thermal analysis is short. Moreover, there is only one thermal analysis action, no more time is required for the thermal analysis. After the end of the thermal analysis, the maximum thermal resistance temperature of the electronic component is compared with the temperature on the surface of the printed circuit board to determine whether to allow the arrangement of the electronic component, so that the time taken for the arrangement task is not long. This makes it possible to reduce the time required for the arrangement task and the thermal analysis processing. In addition, the electronic components that do not meet the preset conditions are low in power consumption and generates a small amount of heat, the generated heat is negligible.

Moreover, the processing performed by the thermal analysis module is enabled by the program to be executed by a computer. Thus, the processing performed by the thermal analysis module may be carried out by the computer which executes part or all of the processing performed by the design support apparatus 10.

Furthermore, the processing for generating the layout data of the present embodiment showing how the electronic components designated by the input from the input unit are arranged at the locations on the printed circuit board designated by the input from the input unit is enabled by a computer program. Therefore, if this computer program is simply installed on a normal computer through a computer-readable storage medium, effects similar to the effects of the present embodiment can be easily obtained. This computer program can be executed not only on a personal computer but also on an electronic device having a processor therein.

Similarly, the processing for conducting a thermal analysis in accordance with the layout data of the present embodiment showing how the electronic components are arranged on the printed circuit board is enabled by a computer program. Therefore, if this computer program is simply installed on a normal computer through a computer-readable storage medium, effects similar to the effects of the present embodiment can be easily obtained. This computer program can be executed not only on a personal computer but also on an electronic device having a processor therein.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A design support apparatus configured to generate layout data showing an arrangement position on a printed circuit board in which an electronic component specified by an input device is arranged, the arrangement position being specified by the input device, the apparatus comprising:
   a component arrangement module configured to generate first layout data showing that a first electronic component whose rated power consumption is not lower than a set value is arranged on the printed circuit board;
   a temperature distribution data acquisition module configured to acquire temperature distribution data showing a temperature distribution on a surface of the printed circuit board, the temperature distribution data being computed by a thermal analysis conducted based on the first layout data and power consumption of the first electronic component;
   a thermal resistance temperature acquisition module configured to acquire a maximum thermal resistance temperature of a second electronic component when the second electronic component is specified by the input device, the second electronic component being arranged on the printed circuit board and having rated power consumption that is lower than the set value;
   a calculator configured to calculate a temperature of the surface of the printed circuit board at the specified arrangement position based on the temperature distribution data when an arrangement position of the second electronic component is specified by the input device;
   a determination module configured to determine whether the specified second electronic component is able to be arranged at the specified arrangement position based on the temperature calculated by the calculator and the maximum thermal resistance temperature acquired by the thermal resistance temperature acquisition module; and
   a prohibition module configured to prohibit the component arrangement module from generating second layout data when the determination module determines that the second electronic component is not able to be arranged at the specified arrangement position, the second layout data indicating the specified arrangement position in which the specified second electronic component is arranged.

2. The design support apparatus of claim 1, wherein the printed circuit board comprises a motherboard of a computer, and
   the first electronic component comprises a semiconductor chip comprising a processor, a semiconductor chip comprising a circuit with a chip set function, a semiconductor chip comprising a graphics processing unit, and a power supply IC.

3. The design support apparatus of claim 1, further comprising a display module configured to display information indicating a temperature of the surface of the printed circuit board based on the temperature distribution data with the information superposed on a figure indicating the printed circuit board.

4. The design support apparatus of claim 1, further comprising a thermal analysis processor configured to conduct the thermal analysis.

5. A design support apparatus comprising:
   a calculator configured to, when a position of a second electronic component whose rated power consumption is lower than a preset power is specified on a printed circuit board on which a first electronic component whose rated power consumption is higher than the preset power, calculate a surface temperature of the specified position from power consumption of the first component; and
   a determination module configured to determine whether the second electronic component is able to be arranged at the specified position based on the surface temperature calculated by the calculator and a thermal resistance temperature of the second electronic component.

6. The design support apparatus of claim 5, wherein the printed circuit board comprises a motherboard of a computer, and
   the first electronic component comprises a semiconductor chip comprising a processor, a semiconductor chip comprising a circuit with a chip set function, a semiconductor chip comprising a graphics processing unit, and a power supply IC.

7. A design support method comprising:

when a position of a second electronic component whose rated power consumption is lower than a preset power is specified on a printed circuit board on which a first electronic component whose rated power consumption is not lower than the preset power, calculating, by a computer, a surface temperature of the specified position from power consumption of the first component; and determining whether the second electronic component is able to be arranged at the specified position based on the calculated surface temperature and a thermal resistance temperature of the second electronic component.

8. The design support method of claim 7, wherein the printed circuit board comprises a motherboard of a computer, and the first electronic component comprises a semiconductor chip comprising a processor, a semiconductor chip comprising a circuit with a chip set function, a semiconductor chip comprising a graphics processing unit, and a power supply IC.

* * * * *